(12) United States Patent
Matsuda et al.

(10) Patent No.: US 9,343,331 B2
(45) Date of Patent: May 17, 2016

(54) METHOD OF MANUFACTURING SEMICONDUCTOR DEVICE

(71) Applicant: KABUSHIKI KAISHA TOSHIBA, Tokyo (JP)

(72) Inventors: Kazuhisa Matsuda, Mie (JP); Toshiyuki Sasaki, Mie (JP); Mitsuhiro Omura, Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/644,908

(22) Filed: Mar. 11, 2015

(65) Prior Publication Data

US 2015/0279697 A1 Oct. 1, 2015

(30) Foreign Application Priority Data

Mar. 27, 2014 (JP) ................................ 2014-066039

(51) Int. Cl.
*H01L 21/3065* (2006.01)
*H01L 21/311* (2006.01)
*H01L 21/3213* (2006.01)

(52) U.S. Cl.
CPC ...... *H01L 21/32136* (2013.01); *H01L 21/3065* (2013.01); *H01L 21/30655* (2013.01); *H01L 21/31116* (2013.01); *H01L 21/31122* (2013.01)

(58) Field of Classification Search
None
See application file for complete search history.

(56) References Cited

U.S. PATENT DOCUMENTS

| | | | | |
|---|---|---|---|---|
| 6,451,647 B1 * | 9/2002 | Yang | ................ | H01L 21/28123 257/310 |
| 7,186,657 B2 * | 3/2007 | Hwang | ............. | H01L 21/31111 134/1.3 |
| 7,598,184 B2 | 10/2009 | Shamiryan et al. | | |
| 8,124,538 B2 * | 2/2012 | Bae | ................... | H01L 21/31122 438/710 |
| 8,183,161 B2 * | 5/2012 | Fernandez | ........ | H01J 37/32091 216/67 |
| 8,258,063 B2 * | 9/2012 | Xu | ..................... | H01L 21/28088 257/E21.31 |
| 8,304,349 B2 * | 11/2012 | Lin, Jr. | ............. | H01L 21/02071 257/410 |
| 8,501,608 B2 * | 8/2013 | Ono | .................. | H01L 21/28123 257/E21.177 |
| 8,722,547 B2 * | 5/2014 | Mani | ................. | H01L 21/31116 216/62 |

(Continued)

FOREIGN PATENT DOCUMENTS

| | | |
|---|---|---|
| JP | 4448607 B2 | 4/2010 |
| JP | 2010-206050 A | 9/2010 |

OTHER PUBLICATIONS

Sha, Lin, et al., "Plasma etching selectivity of $ZrO_2$ to Si in $BCl_3/Cl_2$ plasmas", Journal of Vacuum Science of Technology A, vol. 21, No. 6, p. 1915-1922 (2003).

(Continued)

*Primary Examiner* — Anita Alanko
(74) *Attorney, Agent, or Firm* — Finnegan, Henderson, Farabow, Garrett & Dunner, LLP

(57) ABSTRACT

A method of manufacturing a semiconductor device provided with a stack of a first film substantially free of oxygen and a second film disposed above the first film and comprising a metal oxide containing an uneasily etched material is disclosed. The method includes etching the second film by a first process using a first etch gas containing a boron trichloride containing gas and by a second process following the first process using a second etch gas containing an inert gas. In the second process, the second etch gas is used while a bias power is controlled to be equal to or greater than an etching threshold energy of the second film.

19 Claims, 7 Drawing Sheets

(56) References Cited

U.S. PATENT DOCUMENTS

| | | | |
|---|---|---|---|
| 2005/0081781 A1* | 4/2005 | Lin | H01L 21/28079 117/104 |
| 2007/0056924 A1* | 3/2007 | Wakihara | H05K 1/0269 216/13 |
| 2008/0224238 A1* | 9/2008 | Kanakasabapathy | H01L 21/28088 257/411 |
| 2009/0004870 A1* | 1/2009 | Liu | H01L 21/28282 438/710 |
| 2009/0081872 A1* | 3/2009 | Kobayashi | H01L 21/31122 438/696 |
| 2013/0164940 A1* | 6/2013 | Raley | H01J 37/32192 438/696 |
| 2015/0249017 A1* | 9/2015 | Raley | H01L 21/31111 438/696 |

OTHER PUBLICATIONS

Wang, Chunyu, et al., "Mechanisms and selectivity for etching of $HfO_2$ and Si in $BCl_3$ plasmas", Journal of Vacuum Science of Technology A, vol. 26, No. 4, p. 597-604 (2008).

Bodart, Paul, et al., "$SiCl_4/Cl_2$ plasmas: A new chemistry to etch high-k materials selectivity to Si-based materials", Journal of Vacuum Science of Technology A, vol. 30, No. 2, p. 020602-1-020602-6 (2012).

\* cited by examiner

METHOD OF MANUFACTURING SEMICONDUCTOR DEVICE

CROSS-REFERENCE TO RELATED APPLICATION(S)

This application is based upon and claims the benefit of priority from Japanese Patent Application No. 2014-066039, filed on, Mar. 27, 2014 the entire contents of which are incorporated herein by reference.

FIELD

Embodiments disclosed herein generally relate to a method of manufacturing a semiconductor device.

BACKGROUND

In semiconductor device manufacturing, it has been a challenge to etch a metal oxide containing an uneasily etched material with good controllability without, for example, recessing the underlying film, when etching a stack of an underlay and a metal oxide film containing uneasily etched material(s) for example.

DESCRIPTION

In one embodiment, a method of manufacturing a semiconductor device provided with a stack of a first film substantially free of oxygen and a second film disposed above the first film and comprising a metal oxide containing an uneasily etched material includes etching the second film by a first process using a first etch gas containing a boron trichloride containing gas and by a second process following the first process using a second etch gas containing an inert gas. In the second process, the second etch gas is used while a bias power is controlled to be equal to or greater than an etching threshold energy of the second film.

Embodiments are described herein with reference to the accompanying drawings. The drawings are schematic and are not necessarily consistent with the actual relation between thickness and planar dimensions as well as the ratio of thicknesses between different layers, etc. Further, directional terms such as up, down, left, and right are used in a relative context with an assumption that the surface, on which circuitry is formed, of the later described semiconductor substrate faces up and thus, do not necessarily correspond to the directions based on gravitational acceleration.

Figure 1A:
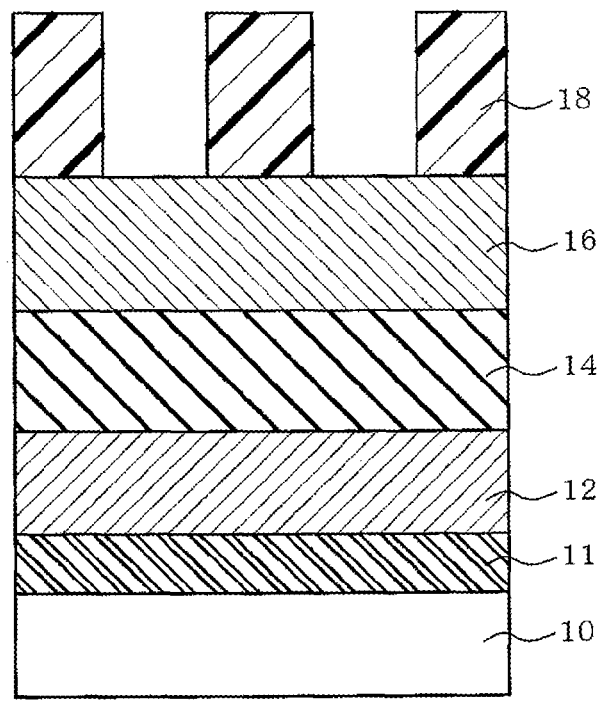
FIGS. 1A and 1B are examples of vertical cross-sectional views illustrating one example of a process flow of a method of manufacturing a semiconductor device of one embodiment.

FIG. 1A, 1B and FIGS. 2A to 2D pertain to one embodiment and are examples of vertical cross sectional views illustrating one example of a process flow of a method of manufacturing a semiconductor device. FIG. 1A is one example of a vertical cross-sectional view schematically illustrating the structure of a semiconductor device just before being subjected to a process of the present embodiment. The present embodiment may be applied to a semiconductor device such as a nonvolatile semiconductor storage device, and more specifically to a flat cell NAND flash memory device for example.

A stack of insulating film 11, lower layer film 12, metal oxide 14, and metal film 16 for example are disposed above semiconductor substrate 10. A silicon substrate may be used for example as semiconductor substrate 10. A substrate of silicon or the like having a film or a stack of films formed thereabove may be used as semiconductor substrate 10. Examples of such films include an insulating film such as a silicon oxide film, a conductive film, and the like. Semiconductor substrate 10 may still alternatively comprise a substrate of silicon or the like having elements such as transistors formed therein which are buried in an insulating film having a planarized upper surface.

A silicon oxide film for example may be used as insulating film 11. Insulating film 11 serves for example as a tunnel film of a memory cell gate provided in a flat cell NAND flash memory device.

A film formed of a material being substantially free of oxygen may be used as lower layer film 12. Examples of such materials include silicon (Si), tungsten (W), titanium (Ti), tantalum (Ta), and nitrides of the foregoing, such as silicon nitride (SiN), tungsten nitride (WN), titanium nitride (TiN), and tantalum nitride (TaN). Lower layer film 12 is used for example as a charge storing layer of a memory cell gate of flat cell NAND flash memory device.

A metal oxide containing an uneasily etched material for example may be used as metal oxide 14. Examples of uneasily etched materials include lanthanum (La), yttrium (Y), magnesium (Mg), iron (Fe), cobalt (Co), nickel (Ni), and barium (Ba).

Examples of metal oxides containing uneasily etched materials include oxides of monometals such lanthanum oxide ($La_2O_3$), yttrium oxide ($Y_2O_3$), and magnesium oxide (MgO) or compounds of metal, aluminum, and silicate such as lanthanum aluminum silicate ($LaAlSiO_x$) and yttrium aluminum silicate ($YAlSiO_x$). A metal oxide such as $LaAlSiO_x$ contains uneasily etched material such as lanthanum and thus, metal oxide as a whole becomes an uneasily etched material. The compositional ratio of the elements of the metal oxide is not limited to a specific ratio.

Figure 1B:
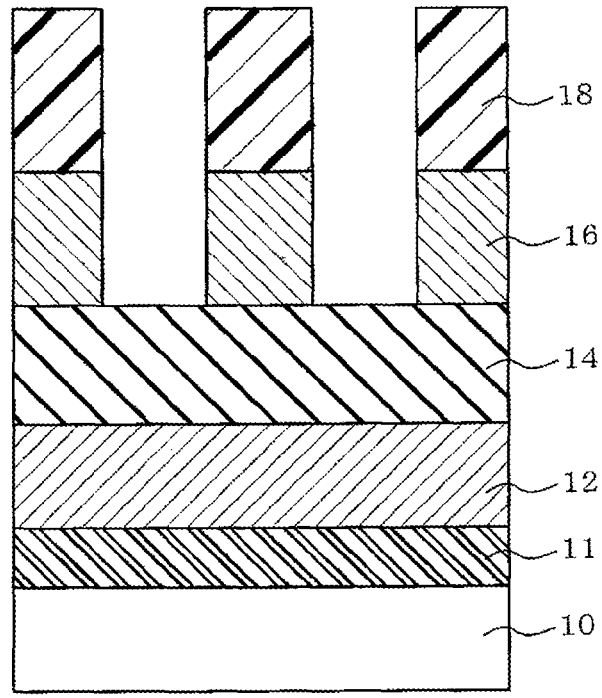

The metal oxide containing uneasily etched material is used for example as a high-dielectric-constant insulating film also referred to as a high-k film. The high-k film may be used for example in a stack structure of a memory cell gate of a flat cell NAND flash memory device. The stack structure may be disposed above a silicon substrate and may include a silicon oxide film, a polycrystalline silicon film, the high-k film, and a metal disposed one above another. FIG. 1A, 1B, and FIGS.

2A, 2B, 2C, and 2D schematically illustrate a stack structure used in a memory cell gate of flat cell NAND flash memory device.

A stack film of tungsten nitride (WN) and tungsten (W) may be a used for example as metal film 16. Metal film 16 is used for example as a control electrode of a memory cell gate of a flat cell NAND flash memory device. Mask 18 is formed above metal film 16. A resist film patterned by lithography for example may be used as mask 18. A hard mask formed by double patterning processes such as a sidewall transfer process may be used as mask 18 instead of the resist film.

Next, as illustrated in FIG. 1B, the pattern of mask 18 is transferred to metal film 16 by the first etch using RIE (Reactive Ion Etching). The first etch is performed under anisotropic conditions and is stopped on metal oxide 14 after etching metal film 16.

Then, the pattern of mask 18 is transferred to metal oxide 14 by subsequently performing the second etch using RIE as illustrated in FIGS. 2A to 2D. The second etch is performed so as to selectively etch metal oxide 14 and stop on lower layer film 12 while inhibiting reduction or recessing of lower layer film 12.

The second etch includes two processes, namely a first process and a second process described below and the second etch progresses by consecutively repeating the alternate execution of the two processes.

The etching performed in the first process employs RIE using boron trichloride ($BCl_3$) gas as an etch gas with the bias power of the etch apparatus (first bias power) specified to be less than the etching threshold energy of lower layer film 12. Such level of bias power is hereinafter referred to as a low bias region.

The etching performed in the second process employs RIE using inert gas as an etch gas with the bias power of the etch apparatus (second bias power) specified to be equal to or greater than the etching threshold energy of metal oxide 14. Such level of bias power is hereinafter referred to as a high bias region.

In this example, ICP (Inductively Coupled Plasma) etch apparatus is used as the etch apparatus.

In the first process, lower layer film 12 is not etched by principle since the bias power is specified in a low bias region being less than the etching threshold energy of lower layer film 12. Further, the etch rate of metal oxide 14 in the first process is extremely low and etch stops are caused by the uneasily etched material. In the first process, deposit 24 is not formed while metal oxide 14 is being etched.

In the second etch, the first process and the second process are executed repeatedly to remove metal oxide 14, and deposit 24 originating from the first process deposits selectively above lower layer film 12 after lower layer film 12 is exposed. Deposit 24 covers the surface of lower layer film 12 and serves as an etch mask to prevent etching of lower layer film 12. Stated differently, the second process being repeated in the second etch inhibits the progress of the etching of lower layer film 12 while allowing over etching. Further, the in-plane dependency of the etch rate prevents the etching of lower layer film 12 from progressing excessively even when the surface of lower layer film 12 is exposed by locally accelerated removal of metal oxide 14.

Deposit 24 is believed to be primarily formed of $BCl_x$. In the first process, deposit 24 is selectively formed above lower layer film 12 and not above metal oxide 14. This may be explained as follows. Deposit 24 formed primarily of $BCl_1$ is formed by etching performed using $BCl_3$. However, an oxygen containing film such as metal oxide 14 supplies oxygen by the reduction action of B and causes a reaction to produce a volatile $BOCl_x$ from $BCl_x$. As a result, the etching progresses without deposition of deposit 24 above metal oxide 14.

In contrast, lower layer film 12 being free of oxygen does not supply oxygen and thus, does not cause reaction to produce a volatile $BOCl_x$ from $BCl_x$. Thus, deposit 24 continues to form above lower layer film 12 and serves as a mask to inhibit the progress of etch.

Lower layer film 12 may contain small amount of oxygen as a result of oxygen in the atmosphere being introduced during film formation or by the formation of a native oxide after film formation. However, if the oxygen content is within the level of unavoidable impurities, formation of deposit 24 above lower layer film 12 will not be inhibited and thus, is permissible. In other words, lower layer film 12 may be formed of a material being substantially free of oxygen.

Metal oxide 14 contains uneasily etched material and thus, is poor in chemical reactiveness. In other words, it is difficult to etch metal oxide 14 by RIE since it exhibits poor chemical reactiveness with the etch gas.

Thus, the second process employs a bias power in the high bias region and an inert gas as an etch gas to etch metal oxide 14 primarily by the sputtering effect of the inert gas. Examples of inert gas include argon (Ar), xenon (Xe), and krypton (Kr). It is thus, possible to etch metal oxide 14, being a film containing uneasily etched material, by using a bias power in the high bias region and by using inert gas as an etch gas.

As described above, among the first process and the second process repeated in the second etch after lower layer film 12 is exposed, deposit 24 is formed above lower layer film 12 in the first process. The duration of the second process is controlled so that deposit 24 is not completely removed while the second process is ongoing. As a result, it is possible to etch metal oxide 14 in the second process while covering the surface of lower layer film 12 with deposit 24 formed in the first process after lower layer film 12 is exposed and thereby prevent lower layer film 12 from receding or recessing by the etching.

In the second etch, the first process and the second process may be repeated any number of times depending upon the thickness, the compositional ratio, etc. of the etch target. The duration of the first process and the second process may also be specified to any time period depending upon the thickness and the compositional ratio of the etch target or depending upon the structure of the workpiece, etc. Further, the duration of the first process and the second process need not be constant but may be variable. For example, the duration of the first process and/or the second process may be gradually reduced as the etch progresses.

As described above, the present embodiment allows the etching of the stack structure of metal oxide 14 containing an uneasily etched material and lower layer film 12 to progress with good controllability in etching metal oxide 14 and without recessing lower layer film 12.

It is possible to add fluorine (F) containing compound gas to the inert gas used as an etch gas in the second process. Examples of fluorine (F) containing compound gas include methane tetrafluoride ($CF_4$), trifluoromethane ($CHF_3$), difluoromethane ($CH_2F_2$), fluoromethane ($CH_3F$) hexafluoro 1,3 butadiene ($C_4F_6$) perfluorocyclobutane ($C_4F_8$), nitrogen trifluoride ($NF_3$), and sulfur hexafluoride ($SF_6$).

Adding the foregoing gases also provides the effect of improving the etch rate of metal oxide 14 while suppressing the etch rate of lower layer film 12 in the second process. In other words, it is possible to improve the etch selectivity of metal oxide 14 to lower layer film 12.

Hydrogen ($H_2$) gas may be further added to the inert gas containing fluorine (F) containing compound gas.

Addition of hydrogen strengthens the effect of improving the etch rate of metal oxide 14 while suppressing the etch rate of lower layer film 12 in the second process. In other words, it is possible to improve the etch selectivity of metal oxide 14 to lower layer film 12 more effectively.

FIG. 2A to FIG. 2D illustrate how the second etch progresses. In the second etch, alternate and consecutive execution of the first process and the second process is repeated multiple times.

Figures 2A, 2B:
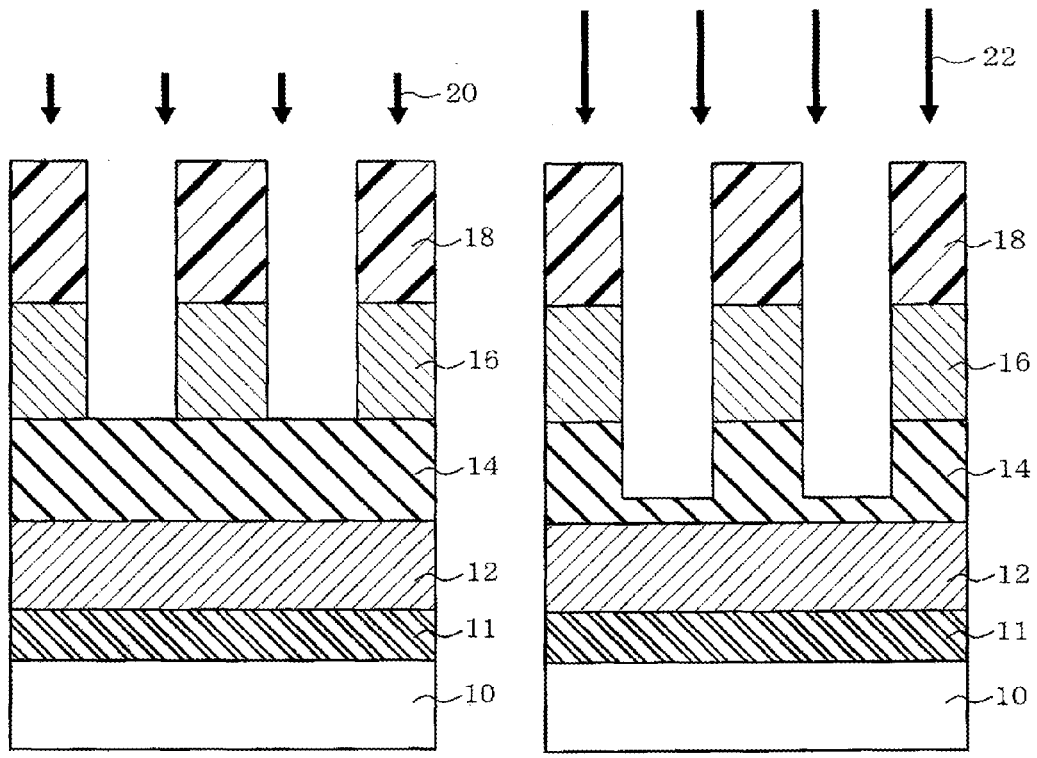
FIGS. 2A, 2B, 2C and 2D are examples of vertical cross-sectional views illustrating one example of a process flow of a method of manufacturing a semiconductor device of one embodiment.

FIG. 2A and FIG. 2B illustrate how the etching of metal oxide 14 progresses after metal film 16 is etched. Metal oxide 14 is the workpiece, i.e. the etch target in the second etch.

FIG. 2A illustrates the initial stage of metal oxide 14 etching in which the first process is ongoing. Sufficient amount of metal oxide 14 exists in FIG. 2A and thus, lower layer film 12 is not exposed. In the first process, first ion 20 is radiated on the surface of the etch target. First ion 20 is an ion generated when plasma is produced based on the etch gas used in the first process. In one embodiment, the etch gas used in the first process is boron trichloride ($BCl_3$).

In the first process, the bias power of the etch apparatus is specified to low bias region and thus, metal oxide 14 is etched with low etch rate as described earlier. As a result, the etching of metal oxide 14 in the first process does not progress in the magnitude to expose the surface of lower layer film 12. Deposit 24 does not form since the surface of lower layer 12 is not exposed.

FIG. 2B illustrates the mid stage of metal oxide 14 etching in which the second process is ongoing. In FIG. 2B, the first process and the second process are repeated multiple times. As a result, the etching progresses midway through the thickness of metal oxide 14. In the second process, second ion 22 is radiated on the surface of the workpiece. Second ion 22 is an inert ion generated when plasma is produced based on the etch gas used in the second process. In one embodiment, the etch gas used in the second process is inert gas such as argon and the inert ion generated by the plasma is $Ar^+$ ion.

In the second process, the bias power of the etch apparatus is specified to high bias region and thus, etching of metal oxide 14 progresses aggressively. In the second process, the etching is driven primarily by physical sputtering caused by inert gas. Thus, the etch rate becomes higher as heavier inert gases such as Xe, Kr, or the like are used.

Figures 2C, 2D:
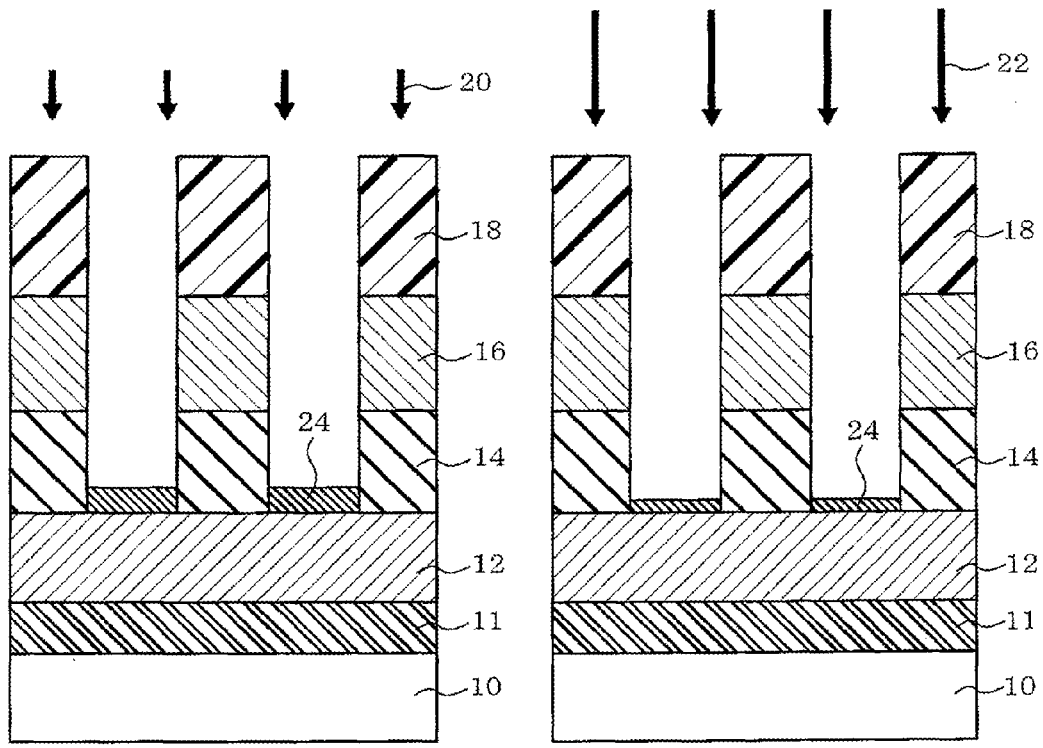

FIGS. 2C and 2D illustrate the second etch in which the surface of lower layer film 12 is exposed as the result of metal oxide 14 being removed by the progression of etch caused by further repetitions of the first process and the second process.

FIG. 2C illustrates deposit 24 selectively formed above the surface of lower layer film 12 in the first process. In the first process, deposit 24 is formed above the surface of lower layer film 12 after lower layer film 12 is exposed. Etching does not progress into lower layer film 12 since lower layer film 12 is covered by deposit 24. In the first process, the bias power is specified to a low bias region being less than the etching threshold energy of lower layer film 12 and thus, etching of lower layer film 12 will not progress even in the absence of deposit 24.

FIG. 2D illustrates the etching (over etching) performed with deposit 24 formed above the surface of lower layer film 12 in the second process. In the second process, deposit 24 formed in the immediately preceding first process covers lower layer film 12 and serves as a mask to prevent the etching of lower layer film 12.

In the second process, the bias power of the etch apparatus is specified to a high bias region and the etching progresses primarily by the physical sputtering effect of inert gas. Thus, if lower layer film 12 is not covered by deposit 24, the etching will progress into lower layer film 12 as well.

Thus, the duration of etching in the second process is controlled so that deposit 24 formed in the first process as described above is not completely removed. In other words, the duration of etch in the second process is controlled within a time period that would allow deposit 24 to remain above lower layer film 12. Because the surface of lower layer film 12 is covered by deposit 24 while the second process is ongoing, it is possible to inhibit recessing of lower layer film 12 by the etching.

Further, the etching performed in the second process using an inert gas is believed to progress primarily by the physical sputtering effect of the inert gas as described above. The etch progressing in the above described manner tends to form the etch target into a forward taper. The first process, carried out by RIE using boron trichloride ($BCl_3$) on the other hand, progresses substantially in the vertical direction and does not form the etch target into a forward taper. It is thus, preferable to employ the first process in addition to the second process in order for the etching to substantially progress in the vertical direction so as not to forwardly taper metal oxide 14. This is another reason for the second etch of the present embodiment for etching metal oxide 14 to adopt a method in which alternate execution of the first process and the second process is repeated.

The possibility of lower layer film 12 being exposed during the etching of metal layer 14 is small while metal oxide film 14 is sufficiently thick. Thus, metal oxide 14 may be etched without considering the possibility of the receding of lower layer film 12 until the thickness of metal oxide 14 is reduced to a predetermined thickness in which the exposure of lower layer film 12 becomes a possibility. For example, the etching of metal oxide 14 may be accelerated by specifying a high bias power (third bias power) in the first process until the thickness of metal oxide 14 is reduced to a predetermined thickness. Then, after metal oxide 14 has reached the predetermined thickness, in which case, the thickness of metal oxide 14 is reduced and lower layer film 12 may soon be exposed, the first process performed in low bias region and the second process performed in high bias region may be repeated.

Further, the present embodiment is described through an example in which metal oxide 14 containing an uneasily etched material is etched. However, the present embodiment is applicable to etching materials that are not uneasily etched materials. For example, the present embodiment may be applied to metal oxides having lower etching threshold energies than the etching threshold energy of an uneasily etched material. Examples of such metal oxides include a silicon oxide film ($SiO_2$), an aluminum oxide ($Al_2O_3$), hafnium oxide ($HfO_2$), and zirconium oxide ($ZrO_2$). Further, metal oxide 14 may be a composite metal oxide film such as lanthanum aluminum silicate ($LaAlSiO_x$), yttrium aluminum silicate ($YAlSiO_x$), or the like that contain an uneasily etched material and a non-uneasily etched material. In such case, the non-uneasily etched material may be etched with priority in the first process to increase the amount of metal oxide 14 being etched until an etch stop is encountered. Etching of such composite metal oxide film of the present embodiment is especially advantageous in that continued execution of RIE progressing substantially in the vertical direction is easily achieved.

As described above, the second etch is terminated after repeating the first process and the second process for a desired number of times. After completing the second etch, lower layer film 12 may be subsequently etched for example as required. The first etch, the second etch, and the etching of lower layer film 12 if required need not be performed in separate etch processes but may be performed as consecutive steps within a single etch process using the same etch apparatus. Further, the endpoints of the first etch and the second etch may be detected for example by carrying out plasma spectroscopy inside the etch chamber.

Next, a description will be given in detail on the first process and the second process of the second etch with reference to the drawings.

Figure 3A:
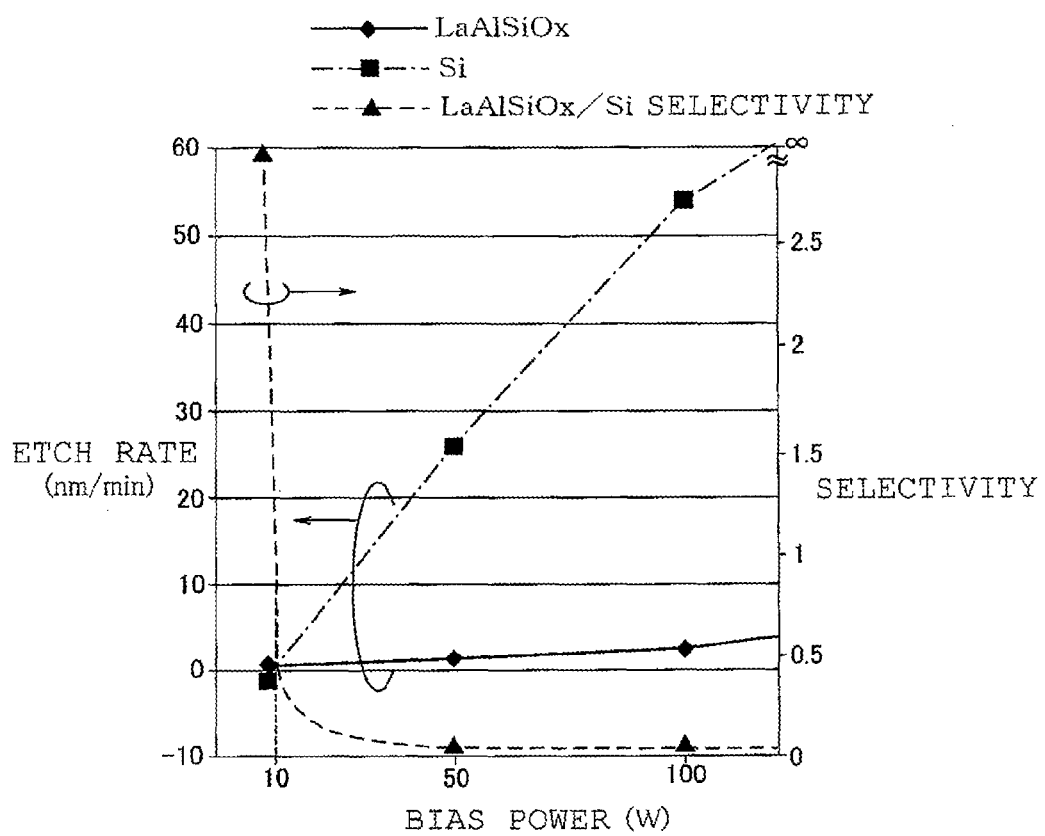
FIG. 3A indicates the result of an experiment conducted on etching carried out in a first process.

FIG. 3A indicates in detail the result of an experiment conducted on the etching performed in the first process. In the chart provided in FIG. 3A, the lateral axis represents the bias power of the etch apparatus. The left-side vertical axis represents the etch rate. The right-side vertical axis represents the etch selectivity.

The experiment was conducted assuming that a film structure used as the memory cell gate in a flat cell NAND flash memory device serves as an etch target. The experiment was conducted using two samples. The first sample was prepared by forming a silicon oxide film and polysilicon (Si), serving as lower layer film 12, above a semiconductor substrate. The second sample was prepared by forming a silicon oxide film and lanthanum aluminum silicate ($LaAlSiO_x$) serving as metal oxide 14 containing an uneasily etched material, above a semiconductor substrate. Polysilicon (Si) serving as lower layer film 12 and $LaAlSiO_x$ serving as metal oxide 14 were etched using the two samples.

In this example, the etching was performed using an inductively coupled etch apparatus with the pressure inside the chamber specified to 10 mTorr, the source power to 1000 W, and the substrate temperature to 210 degrees Celsius. Boron trichloride ($BCl_3$) was used as an etch gas.

FIG. 3A indicates the etch rates of $LaAlSiO_x$ and Si as well as dependency of etch selectivity of $LaAlSiO_7$ to Si (hereinafter simply referred to as selectivity) on bias power.

FIG. 3A clearly indicates that Si etch rate increases significantly with the increase in the bias power while $LaAlSiO_x$ etch rate increases at a low rate with the increase in the bias power. In contrast, Si etch rate is low when the bias power is less than 50 W, and especially when the bias power is equal to or less than 10 W, Si etch rate takes a negative value which means that a deposition film is formed above Si. By comparison, $LaAlSiG_x$ etch rate is extremely low; however, no significant change is observed in $LaAlSiO_x$ etch rate. Selectivity is approximately 0.1 when the bias power is equal to or greater than 50 W but improves when the bias power becomes less than 50 W and increases significantly when the bias power is equal to or less than 10 W.

The result of the experiment provides the following insights when the first process employs a boron trichloride gas as an etch gas for etching lanthanum aluminum silicate ($LaAlSiO_x$) serving as metal oxide 14 and polysilicon (Si) serving as lower layer film 12. The bias power is preferably specified to 10 W or less when a deposition film is formed above lower layer film 12 (Si) and for securing sufficient $LaAlSiO_x$ etch rate. Thus, in this example, the region less than the etching threshold energy of lower layer film 12, in other words, the low bias region indicates the region in which the bias power is equal to or less than 10 W.

Figure 3B:
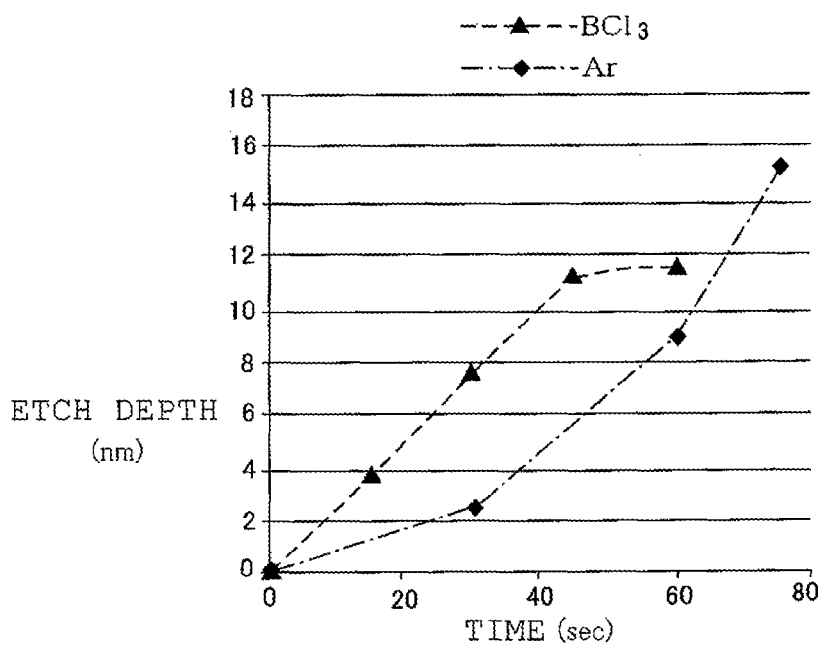
FIG. 3B indicates the result of an experiment conducted when boron trichloride and argon are used as etch gases.

FIG. 3B indicates the result of an experiment conducted using boron trichloride ($BCl_3$) as an etch gas and argon (Ar) as an inert gas in etching $LaAlSiO_x$. The experiment was conducted using a sample in which lanthanum aluminum silicate ($LaAlSiO_x$) serving as metal oxide 14 containing an uneasily etched material is formed above polysilicon (Si) serving as lower layer film 12, which is in turn formed above a semiconductor substrate. In this example, $LaAlSiO_7$ serves as the etch target and the bias power is specified to 300 W.

In the chart provided in FIG. 3B, the lateral axis represents the etch time, in other words, the duration of etching. The vertical axis represents the etch depth, in other words, the depth of the etch progressing into the etch target which is $LaAlSiO_x$ in this example. As clearly indicated in FIG. 3B, the etch depth does not go beyond approximately 11.5 nm after the elapse of approximately 40 sec of etch time in the etching using boron trichloride ($BCl_3$) etch gas. In other words, the etching is stopped at the depth of approximately 11.5 nm, indicating a saturation of etch amount, and thus, etching of $LaAiSiO_x$ does not proceed any further.

In the etching using argon (Ar) on the other hand, the result of the experiment indicates that the etch amount of $LaAlSiO_x$ increases with the lapse of etch time and the etching of $LaAlSiO_x$ continues without stopping. The result of the experiment indicates that it is preferable to also apply physical sputtering in addition to the etching using boron trichloride ($BCl_3$) as an etch gas when etching $LaAlSiO_x$, which is one example of metal oxide 14 containing an uneasily etched material, and that it may not be appropriate to use boron trichloride ($BCl_3$) alone as an etch gas. In the present embodiment, the second process uses an inert gas such as argon (Ar) in the etching.

Next, a description will be given in detail on the etching performed in the second process with reference to FIGS. 4A, 4B, 5, 6, and 7. FIGS. 4A, 4B, 5, 6, and 7 indicate in detail the result of an experiment conducted on the etching in the second process.

Figure 4A:
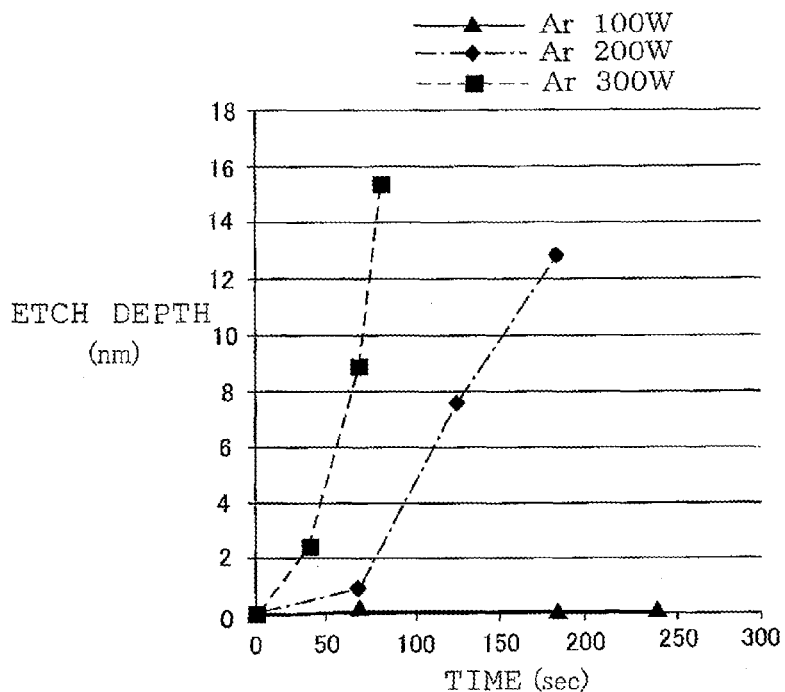
FIGS. 4A and 4B are charts indicating the results of experiments conducted on etching carried out in a second process.

FIG. 4A indicates the dependency of etch depth of the second process on bias power. In this example, argon (Ar) was used as an inert gas of etch gas in etching a sample. The sample was prepared by forming lanthanum aluminum silicate ($LaAlSiO_x$) serving as metal oxide 14 containing an uneasily etched material above polysilicon (Si) serving as lower layer film 12 which is in turn formed above a semiconductor substrate.

In the chart provided in FIG. 4A, the lateral axis represents the etch time. The vertical axis represents the etch depth, in other words, the depth of the etch progressing into the etch target. The chart in FIG. 4A indicates the relation between the etch time and the etch amount when the bias power is specified to 100 W, 200 W, and 300 W under the above described conditions.

As clearly indicated in FIG. 4A, the etching of $LaAlSiO_x$ progresses when the bias power is equal to or greater than 200 W but not when the bias power is 100 W. The result of the experiment indicates that it is preferable in the second process to specify the bias power to 200 W or greater when using argon (Ar) as an etch gas in etching $LaAlSiO_x$ which is one example of metal oxide 14 being an etch target. Thus, in this example, the region equal to or greater than the etching threshold energy of metal oxide 14, in other words, the high bias region indicates the region in which the bias power is equal to or greater than 200 W.

Figure 4B:
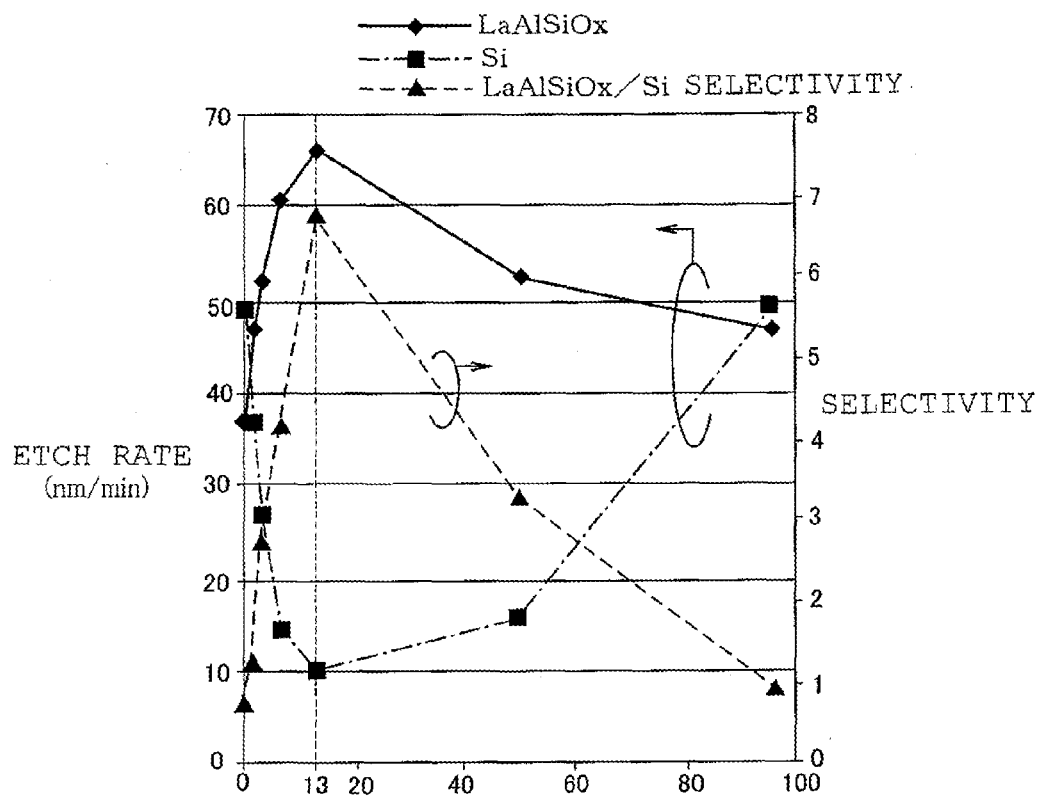

Referring next to FIG. 4B, a description will be given on the effect of adding fluorine (F) containing gas and hydrogen ($H_2$) to inert gas in the second process. The experiment indicated in FIG. 4B was conducted using two samples as etch targets. The first sample was prepared by forming a silicon oxide film and polysilicon (Si), serving as lower layer film 12, above a semiconductor substrate. The second sample was prepared by forming a silicon oxide film and lanthanum aluminum silicate ($LaAlSiO_x$), serving as metal oxide 14 containing an uneasily etched material, above a semiconductor substrate. Polysilicon (Si) serving as lower layer film 12 and LaAlSiO$_x$ serving as metal oxide 14 were etched using the two samples.

Further, argon (Ar) serving as inert gas containing perfluorocyclobutane (C$_4$F$_8$) and hydrogen additives is used as an etch gas. FIG. 4B indicates the etch rates of each etch target when mixture ratio (ratio of flow rate) of these gases are varied.

In FIG. 4B, the lateral axis represents the ratio of the flow rate of hydrogen in the total flow rate of the gas mixture of argon (Ar), perfluorocyclobutane (C$_4$F$_8$), and hydrogen (H$_2$) which may be expressed as H$_2$/C$_4$F$_8$+H$_2$+Ar and hereinafter simply referred to as hydrogen flow rate ratio. The left-side vertical axis represents the etch rate and the right-side vertical axis represents the etch selectivity of LaAlSiO$_x$ to silicon, hereinafter simply referred to as selectivity.

In this example, the flow rate of perfluorocyclobutane (C$_4$F$_8$) is fixed to 4% of the total flow rate of the gas mixture. Further, the bias power is specified to 1200 W belonging to the high bias region.

As clearly indicated in FIG. 4B, the etch rate of LaAlSiO$_x$ increases with the increase in the amount of hydrogen (H$_2$) gas additives and is maximized when the flow rate ratio of hydrogen is 13%. The etch rate of LaAlSiO$_x$ becomes lower as the flow rate ratio of hydrogen becomes further greater, but is still sufficiently higher than etch rate of LaAlSiO$_x$ when no hydrogen is added, in other words, when the flow rate ratio of hydrogen is near 0 (zero).

In contrast, the etch rate of polysilicon becomes lower as the flow rate ratio of hydrogen becomes greater and is minimized when the flow rate ratio of hydrogen is approximately 13%. However, the etch rate of polysilicon increases as the flow rate ratio of hydrogen becomes further greater, in this example, greater than 13%.

The selectivity increases as the flow rate ratio of hydrogen becomes greater and is maximized to approximately 6.7 at approximately 13%. The selectivity, however, decreases when the flow rate ratio of hydrogen becomes further greater.

In the second process described above, a high LaAlSiO$_x$ etch rate is achieved substantially throughout the entire range of the flow rate ratio of hydrogen when etching LaAlSiO$_x$, serving as metal oxide 14 containing uneasily etched material, using inert gas containing fluorine containing gas and hydrogen gas.

The etch rate of LaAlSiO$_2$ is sufficiently high when the flow rate ratio of hydrogen is 0 (zero). In the second etch, the etching of lower layer film 12 (Si) is inhibited by deposit 24 formed above lower layer film 12 by the first process. Thus, the gas mixture of argon (Ar) and perfluorocyclobutane (C$_4$F$_8$) in which the flow rate ratio of hydrogen is 0 (zero), meaning that there is no hydrogen content, can be said to be appropriate as an etch gas used in the second process.

Further, high selectivity is achieved substantially throughout the entire range of the flow rate ratio of hydrogen. It can be presumed that an improvement in the selectivity of metal oxide 14 to lower layer film 12 is achieved by the increase in the etch rate of metal oxide 14 containing uneasily etched material caused by adding fluorine containing gas and hydrogen gas to inert gas. As described above, it can be understood that the etch rate as well as the selectivity of metal oxide 14 are improved when argon (Ar) gas containing perfluorocyclobutane (C$_4$F$_8$) and hydrogen (H$_2$) additives are used as an etch gas in the second process.

Figure 5:
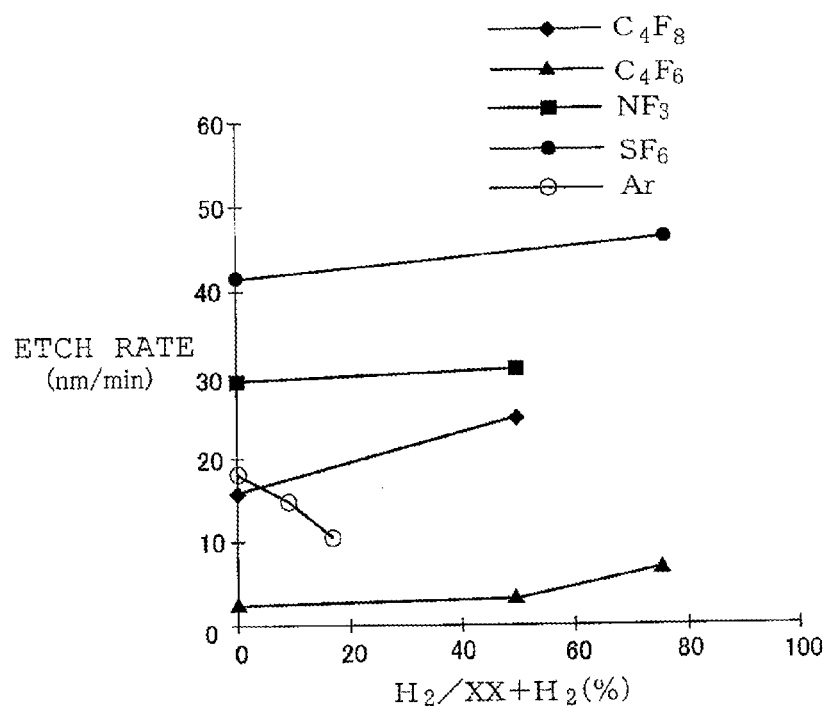
FIG. 5 is a chart indicating the result of an experiment conducted on etching carried out in the second process.

Referring further to FIG. 5, a description will be given on the effect of using an etch gas in which hydrogen gas is added to various types of compound gas containing fluorine and to argon gas. In FIG. 5, the lateral axis represents the ratio of the flow rate of hydrogen in the total flow rate of the gas mixture of argon (Ar) or a fluorine containing compound gas (C$_4$F$_8$, C$_4$F$_6$, NF$_3$, SF$_6$) and hydrogen (H$_2$) which may be expressed as H$_2$/XX+H$_2$. The vertical axis represents the etch rate. In this example, XX represents argon (Ar) or fluorine containing compound gas (C$_4$F$_8$, C$_4$F$_6$, NF$_3$, SF$_6$). The total flow rate of the gas mixture is constant.

FIG. 5 provides the following insights. By adding hydrogen to argon, meaning that XX=Ar, argon is diluted by hydrogen. As a result, partial pressure of argon is reduced to cause the sputtering effect to be reduced which in turn reduces the etch rate. On the other hand, when hydrogen is added to fluorine (F) containing compound gas (C$_4$F$_8$, C$_4$F$_6$, NF$_3$, SF$_6$), it can be understood that the etch rate is increased in all the gas species when the amount of hydrogen additive is increased. This is believed to be attributable to hydrogen changing the state of bonding of the components in the surface and the bulk of LaAlSiO$_x$ and facilitating bonding with fluorine contained in the etch gas.

That is, the use of an inert gas containing fluorine (F) containing gas and hydrogen (H$_2$) gas additives as an etch gas in the second process increases the etch rate of metal oxide 14 and the selectivity of metal oxide 14 to silicon. It is thus, possible to improve the effect of the present embodiment.

Figure 6:
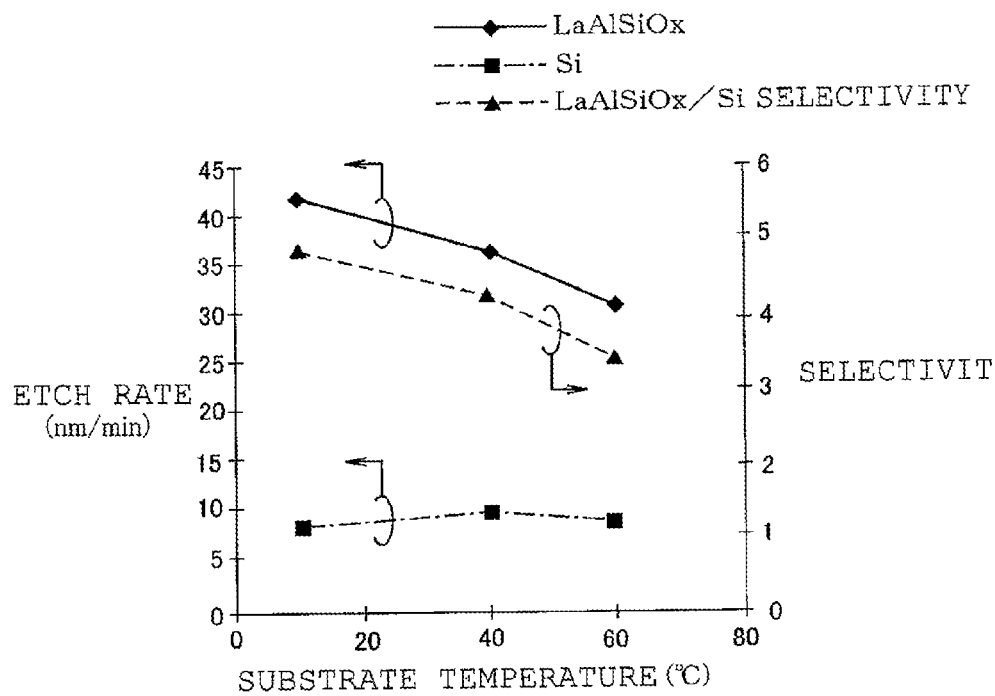
FIG. 6 is a chart indicating the result of an experiment conducted on etching carried out in the second process.

Referring further to FIG. 6, a description will be given on the effect of substrate temperature on the etch selectivity of LaAlSiOx to silicon. FIG. 6 indicates the dependency of etch selectivity of LaAlSiO$_x$ to silicon on substrate temperature. In FIG. 6, the lateral axis represents the substrate temperature and the left-side vertical axis represents the etch rate. The right-side vertical axis represents the etch selectivity. In this example, LaAlSiO$_x$ and silicon (Si) are etched using a gas mixture of C$_4$F$_8$/H$_2$/Ar as an etch gas.

As can be understood from FIG. 6, the etch rate of LaAlSiO$_x$ is increased by reducing the substrate temperature; however, no significant change is observed in the etch rate of silicon. Thus, the etch selectivity of LaAlSiOx to silicon becomes higher as the substrate temperature becomes lower. Stated differently, LaAlSiOx can be etched more selectively with respect to silicon as the substrate temperature becomes lower.

Figure 7:
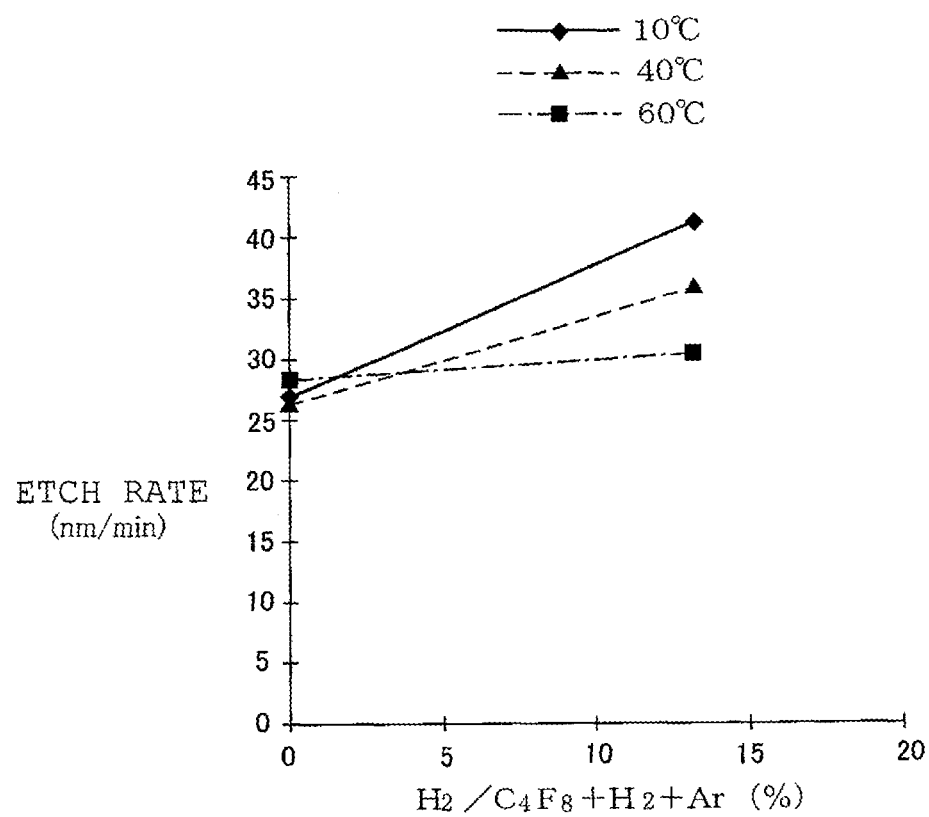
FIG. 7 is a chart indicating the result of an experiment conducted on etching carried out in the second process.

Referring further to FIG. 7, a description will be given on the effect of substrate temperature on the etch rate of LaAlSiO$_x$. FIG. 7 indicates the dependency of LaAlSiO$_x$ etch rate on substrate temperature. In FIG. 7, the lateral axis represents the ratio of flow rate of hydrogen in the total flow rate of the gas mixture of argon (Ar), perfluorocyclobutane (C$_4$F$_8$) and hydrogen (H) which may be expressed as H$_2$/C$_4$F$_8$+H$_2$+Ar. The vertical axis represents the etch rate of LaAlSiO$_x$ and substrate temperatures, namely 10, 40, and 60 degrees Celsius are given as parameters. In this example, LaAlSiO$_x$ is etched using a gas mixture of C$_4$F$_8$/H$_2$/Ar as an etch gas.

As clearly indicated in FIG. 7, the increase in the etch rate of LaAlSiO$_x$ attributable to the addition of hydrogen in C$_4$F$_8$/H$_2$/Ar gas mixture becomes significant when the substrate temperature is equal to or less than 40 degrees Celsius. It is believed that the increase in the percentage of H, F, CF radical attachment caused by reduced substrate temperature is contributing to the increase in the etch rate.

It can be understood from the above described results that it is effective to control the substrate temperature to low temperatures and preferably to a substrate temperature of 40 degrees Celsius or less when etching LaAlSiOx, in other words, the metal oxide containing an uneasily etched material using inert gas containing additives of fluorine (F) containing compound gas and hydrogen (H$_2$) gas.

Further, in the present embodiment, the second process in the second etch may include two steps as described below. The second process may be arranged to include a first step of radiating hydrogen (H$_2$) plasma and a second step of performing an etch process using a hydrogen (H2) free gas mixture containing an inert gas and fluorine containing compound gas.

Figure 8:
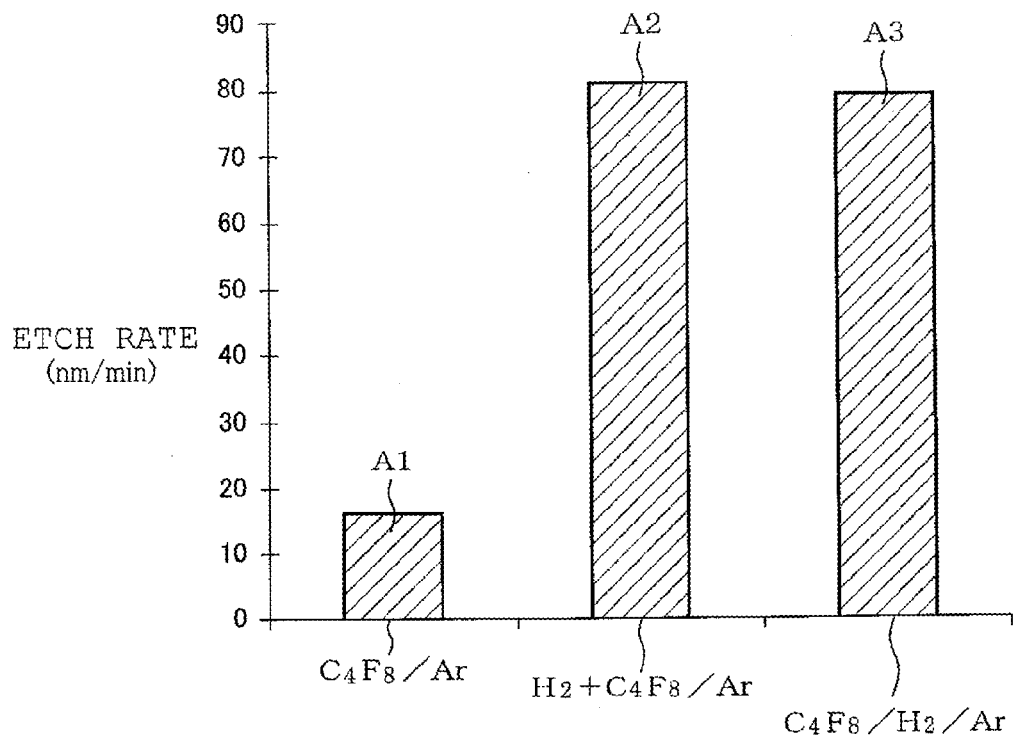
FIG. 8 is a chart indicating the effect of radiating $H_2$ plasma and the effect of adding $H_2$ in the etch gas.

Referring to FIG. 8, a description will be given on the effect of H$_2$ plasma radiation performed prior to the etch process using C$_4$F$_8$/Ar gas mixture and the effect of adding H$_2$ in the etch gas. In FIG. 8, the vertical axis represents the etch rate (nm/min) of LaAlSiO$_x$. Graph A1 represents the etch rate when a gas mixture of C$_4$F$_8$/Ar is used as an etch gas. C$_4$F$_8$/Ar denotes that C$_4$F$_8$, being an example of fluorine containing gas, is added to Ar being an example of inert gas. Graph A2 represents the etch rate when a gas mixture of C$_4$F$_8$/Ar is used in the etching performed in the second step following H$_2$ plasma radiation performed in the first step. Graph A3 represents the etch rate when a gas mixture of C$_4$F$_8$/Ar and H$_2$ additive, i.e. a gas mixture of C$_4$F$_8$/Ar/H$_2$ is used as an etch gas. The etch target is LaAlSiO$_x$ (metal oxide 14) in all three cases. Bias power is specified to 1200 W in all three cases. By specifying the bias power to 1200 W, the bias power is rendered equal to or greater than the etching threshold energy of LaAlSiO$_x$ (metal oxide 14) being etched using C$_4$F$_8$/Ar gas mixture or C$_4$F$_8$/Ar/H$_2$ gas mixture.

As clearly indicated in FIG. 8, the etch rates of graph A2 and graph A3 are much greater compared to the etch rate of graph A1. The etch rates of graph A2 and graph A3 are substantially equal.

As described above, an increase in the etch rate is observed in etching LaAlSiO$_x$ not only when H$_2$ is added to the gas mixture of C$_4$F$_8$/Ar as represented by graph A3 but also when etching is performed using the gas mixture of C$_4$F$_8$/Ar after H$_2$ plasma radiation as represented by graph A2. The increase in LaAlSiO$_x$ etch rate is believed to be attributable to the increase in the etch rate of a damage layer formed by the debonding of components in LaAlSiO$_x$ caused by radiation of H$_2$ plasma.

Thus, the second process of the present embodiment may be arranged to include a first step of radiating H$_2$ plasma and a second step of etching performed using a gas mixture of C$_4$F$_8$/Ar following the first step. The above described arrangement also obtains the effects similar to those of the second process carried out using the gas mixture of C$_4$F$_8$/H$_2$/Ar as the etch gas.

Further, it is possible to specify the bias power of the first step and the second step independently to desired values by arranging the second process to include a first step of using hydrogen (H$_2$) plasma and a second step of using a gas mixture of C$_4$F$_8$/Ar as described above. In the second process in which the etch progresses primarily by the physical sputtering using inert gas, the bias power is specified to high bias region in order to improve the etch rate of LaAlSiO$_x$. In the high bias region, however, the gas chemistry containing H$_2$ may damage lower layer film 12 or semiconductor substrate 10. Thus, the second process is divided into the first step of radiating H2 plasma and the subsequent second step of performing etching using a gas mixture of C$_4$F$_8$/Ar. The bias powers of these steps are controlled independently. As a result, it is possible to specify an appropriate bias power for each step and reduce damages to lower layer film 12 while increasing the etch rate of LaAlSiOx.

Figure 9:
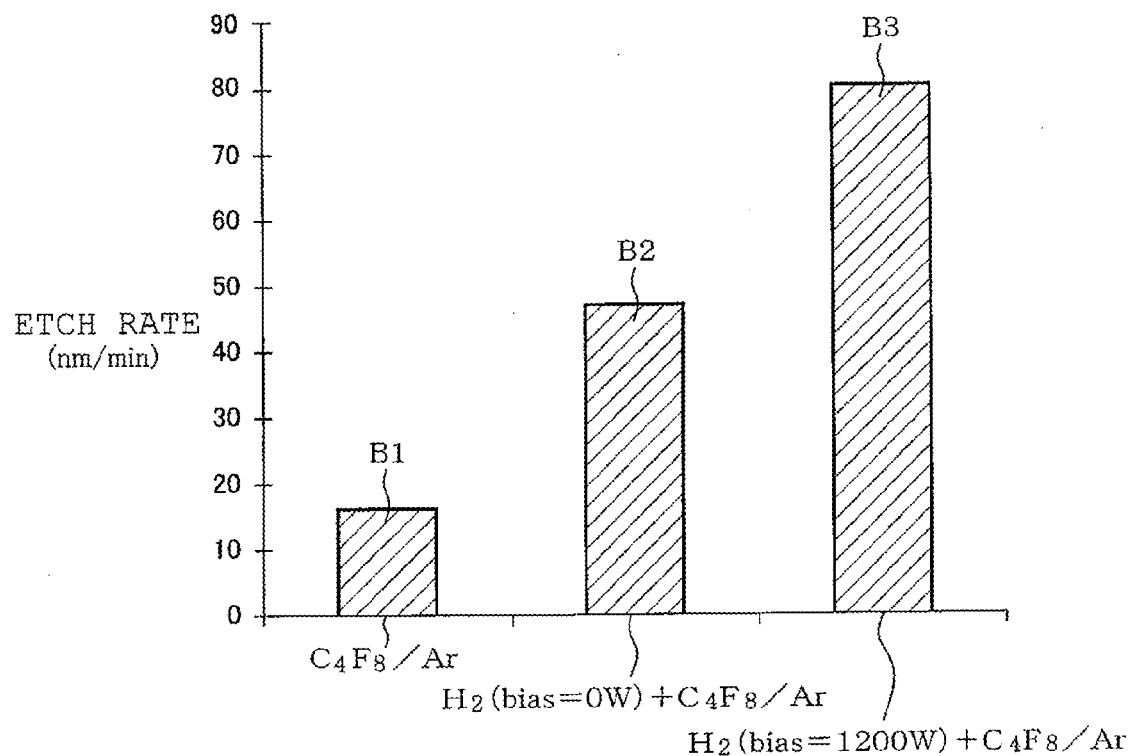
FIG. 9 is a chart indicating the effect of $H_2$ plasma on the etch rate of LaAlSiOx.

It is desirable to control the bias power of the first step using H$_2$ plasma to a level that allows the damage layer for increasing the etch rate of LaAlSiO$_x$ to be sufficiently thick and prevents lower layer 12 from being damaged. FIG. 9 is a graph for indicating the effect of the bias power on the etch rate of LaAlSiO$_x$ in the first step using H$_2$ plasma. In FIG. 9, the vertical axis represents the etch rate of LaAlSiO$_x$. In graph H1, etch was performed using a gas mixture of C$_4$F$_8$/Ar as an etch gas. C$_4$F$_8$/Ar denotes that C$_4$F$_8$ is added to Ar, being an example of inert gas. The results of graph B2 and graph B3 were obtained by radiating H$_2$ plasma in the first step and thereafter performing the etch using the gas mixture of C$_4$F$_8$/Ar in the second step. The etch target is LaAlSiO$_x$ (metal oxide 14) in all three cases.

In FIG. 9, graph B1 indicates the etch rate when the gas mixture of C$_4$F$_8$/Ar is used as an etch gas. Graph B2 indicates the etch rate when etching is performed using the gas mixture of C$_4$F$_8$/Ar in the second step after radiating H$_2$ plasma in the first step. in graph B2, a bias power of 0 W, having substantially 0 ion energy, was used in the first step. In the second step, a bias power of 1200 W, being equal to or greater than the etching threshold energy of LaAlSiO$_x$ serving as metal oxide 14 was used. Graph B3 indicates the etch rate when the etching is performed using the gas mixture of C$_4$F$_8$/Ar in the second step after radiating H$_2$ plasma in the first step. In graph B3, a bias power of 1200 W, being equal to or greater than the etching threshold energy of LaAlSiO$_x$ serving as metal oxide 14, was used in both the first step and the second step.

As clearly indicated in FIG. 9, the etch rate indicated in graph B2 is lower than the etch rate indicated in graph B3 but higher than the etch rate indicated in graph B1. When the bias power is specified to 0 W, meaning that ion energy is approximately 0, it can be presumed that damages suffered by lower layer film 12 by H$_2$ plasma are significantly reduced. Thus, it is possible to increase the etch rate of LaAlSiO$_x$ while reducing damages to lower layer film 12 by radiating H$_2$ plasma with 0 W bias power in the first step and thereafter performing the etching using the gas mixture of C$_4$F$_8$/Ar in the second step. Accelerated processing with reduced damages achieved in the above described sequence of process steps improves throughput and thereby provides a manufacturing method of a semiconductor device capable of manufacturing highly reliable semiconductor devices. From the stand point of reducing damages to lower layer film 12 when dividing the second process into the first step and the second step, the bias power of the first step may be specified to any given value other than 0 W as long as such value is less than the bias power of the second step (second bias power). In other words, the bias power of the first step may be specified to a value higher than 0 W and low enough to allow damages to lower layer film 12 to be reduced.

Other Embodiments

The foregoing embodiment was described through an example of an ICP etch apparatus; however other types of plasma etch apparatuses such as a CCP (Capacitive Coupled Plasma) type, ECR (Electron Cyclotron Resonance) type, and helicon wave type may be used instead.

The embodiments described above may be applied to methods of manufacturing various types of semiconductor devices including various types of storage devices such as a NAND type or a NOR type flash memory, EEPROM, DRAM, and SRAM; and various type of logic devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device provided with a stack of a first film substantially free of oxygen and a second film disposed above the first film and comprising a metal oxide containing an uneasily etched material, the method comprising:
    etching the second film by a first process using a first etch gas containing a boron trichloride containing gas and by a second process following the first process using a second etch gas containing an inert gas, the second etch gas being used in the second process while controlling a bias power to be equal to or greater than an etching threshold energy of the second film,
    wherein the uneasily etched material contains at least one material selected from the group consisting of lanthanum, yttrium, magnesium, iron, cobalt, nickel, and barium.

2. The method according to claim 1, wherein the first process controls a bias power to be less than an etching threshold energy of the first film.

3. The method according to claim 1, wherein the first process and the second process are executed alternately and the alternate execution is repeated.

4. The method according to claim 1, wherein the second etch gas used in the second process further contains a fluorine-containing gas.

5. The method according to claim 1, wherein the second etch gas used in the second process is a gas mixture comprising an inert gas, a fluorine-containing gas, and a hydrogen gas.

6. The method according to claim 1, wherein the second process includes radiating hydrogen plasma and etching using the second etch gas containing an inert gas and a fluorine-containing gas.

7. The method according to claim 4, wherein the fluorine-containing gas contains at least one material selected from the group consisting of methane tetrafluoride, trifluoromethane, difluoromethane, fluoromethane, hexafluoro 1,3 butadiene, perfluorocyclobutane, nitrogen trifluoride, and sulfur hexafluoride.

8. The method according to claim 2, wherein after the first film is exposed by removing the second film by etching, a deposit originating from the first process is formed along the first film.

9. The method according to claim 8, wherein a duration of the second process is controlled so that the deposit, being reduced by etching in the second process, remains along the first film.

10. The method according to claim 1, wherein the first film contains at least one material selected from the group consisting of silicon, tungsten, titanium, tantalum, silicon nitride, tungsten nitride, titanium nitride, and tantalum nitride.

11. The method according to claim 5, wherein the second process controls a substrate temperature to be equal to or less than 40 degrees Celsius.

12. A method of manufacturing a semiconductor device, in which a metal oxide film containing an uneasily etched material is etched using reactive ion etching, comprising:
    repeating an alternate execution of a first process using a first etch gas containing a boron trichloride containing gas and a second process using a second etch gas containing an inert gas to etch the metal oxide film,
    wherein the uneasily etched material contains at least one material selected from the group consisting of lanthanum, yttrium, magnesium, iron, cobalt, nickel, and barium.

13. The method according to claim 12, wherein the metal oxide film is a composite metal oxide film further containing a metal oxide which is not an uneasily etched material.

14. The method according to claim 12, wherein the second etch gas used in the second process further contains a fluorine-containing gas.

15. The method according to claim 12, wherein the second etch gas used in the second process is a gas mixture comprising an inert gas, a fluorine-containing gas, and a hydrogen gas.

16. The method according to claim 12, wherein the second process includes radiating hydrogen plasma and etching using the second etch gas containing an inert gas and a fluorine-containing gas.

17. The method according to claim 12, wherein the first process employs a first bias power and the second process employs a second bias power greater than the first bias power.

18. The method according to claim 17, further comprising etching the metal oxide film using a third etch gas containing a boron trichloride containing gas with a third bias power greater than the first bias power before repeating the alternate execution of the first process with the first bias power and the second process with the second bias power.

19. The method according to claim 15, wherein the second process controls a substrate temperature to be equal to or less than 40 degrees Celsius.

\* \* \* \* \*